United States Patent
Vinayak

(10) Patent No.: US 9,088,205 B2
(45) Date of Patent: Jul. 21, 2015

(54) STABILIZING A POWER COMBINING POWER SUPPLY SYSTEM

(71) Applicant: Quantance, Inc., San Mateo, CA (US)

(72) Inventor: Vikas Vinayak, Menlo Park, CA (US)

(73) Assignee: QUANTANCE, INC., San Mateo, CA (US)

( * ) Notice: Subject to any disclaimer, the term of this patent is extended or adjusted under 35 U.S.C. 154(b) by 154 days.

(21) Appl. No.: 13/967,104

(22) Filed: Aug. 14, 2013

(65) Prior Publication Data
US 2015/0048883 A1 Feb. 19, 2015

(51) Int. Cl.
*H03G 3/20* (2006.01)
*H02M 3/06* (2006.01)
*H03F 3/189* (2006.01)

(52) U.S. Cl.
CPC ............... *H02M 3/06* (2013.01); *H03F 3/189* (2013.01); *H03G 3/20* (2013.01)

(58) Field of Classification Search
CPC ....................................................... H03G 3/30
USPC ........... 330/127, 136, 296, 297; 307/125–128
See application file for complete search history.

(56) References Cited

U.S. PATENT DOCUMENTS

| | | |
|---|---|---|
| 6,984,969 B1 | 1/2006 | Liu et al. |
| 7,454,238 B2 | 11/2008 | Vinayak et al. |
| 2005/0064830 A1 | 3/2005 | Grigore |

*Primary Examiner* — Robert Pascal
*Assistant Examiner* — Khiem Nguyen
(74) *Attorney, Agent, or Firm* — Lando & Anastasi, LLP

(57) ABSTRACT

A power supply system comprising a power stabilization stage configured to combine a first reference signal having a first frequency range with a second reference signal having a second frequency range that is different than the first frequency range to generate a combined reference for driving a reference load. A first power supply (e.g. SMPS) is configured to generate a first output based on the first reference signal. A second power supply (e.g. linear regulator) is configured to generate a second output based on the second reference signal. A power combiner circuit is configured to combine the first output with the second output to generate a combined output for driving an output load.

20 Claims, 3 Drawing Sheets

STABILIZING A POWER COMBINING POWER SUPPLY SYSTEM

BACKGROUND

1. Field of the Disclosure

The present disclosure relates to a power supply and, more specifically, to stabilizing a power combining power supply system.

2. Description of the Related Art

Many electronic devices tend to require much more sophisticated power supplies for supplying power. For example, many electronics may require high frequency of operation, high overall efficiency, few components, and/or low ripple in the power supplied by the power supplies.

More specifically, there is often a need for a power supply circuit that is capable of delivering power with high frequency components (fast changing voltage and current), at high overall power conversion efficiency. For example, an RF (Radio Frequency) PA (power amplifier) can be fed by an efficient power supply at a reduced voltage, allowing the PA to operate more efficiently (i.e., with lower power consumption). In these RF power amplifiers, the power supply must be capable of changing the output voltage very quickly to accommodate rapid changes in the output power of the PA, requiring the power supply to deliver high frequency components of power. At the same time, a high overall efficiency is desired in the power supply to achieve the desired lower power consumption. A typical switched-mode power supply (SMPS) circuit achieves high efficiency, but cannot deliver sufficiently high frequency components of the power, because the low switching frequencies commonly used in these types of regulators (a limitation largely imposed by the magnetics) limits the regulator's bandwidth. Linear regulators, on the other hand, may be designed to deliver high frequency components, but the power conversion efficiency of such a linear regulator is poor. Thus neither a common SMPS nor a linear regulator can meet this need.

Another example of the need for a power supply that is both efficient and can deliver a fast changing power is one which supplies a digital circuit, which may include a microprocessor. The digital circuit may operate more efficiently if fed by a power supply that adjusts its voltage dynamically to match the predicted processing needs. Typically, the voltage is adjusted upwards when the digital circuit is operating at high speeds, and downward when operating at lower speeds. While conventional power supplies can typically change their voltage within 50 μs, this delay may prevent the digital circuitry from operating at peak efficiency, and a power supply which adjusts its voltage more quickly to allow for a more frequent change in clocking speeds of the digital circuitry is desirable.

There have been some efforts to design power supply circuits that can operate at high frequencies and are also power efficient. One conventional technique uses both a SMPS and a linear regulator to provide power to a load. The linear regulator provides the high frequency power components, and the switching regulator provides the low frequency and DC power components. An inductor and a capacitor are used to combine the outputs from the SMPS and linear regulator to form the output power of the power supply for the load. The configuration of inductor and capacitor causes unwanted ringing that is counteracted by increasing the output impedance of the SMPS and the linear regulator. However, increasing the output impedance of the power supplies has the negative consequence of reducing the efficiency of the power supply circuit.

SUMMARY

Embodiments of the present invention include a power supply system comprising a power stabilization stage configured to combine a first reference signal having a first frequency range with a second reference signal having a second frequency range that is different than the first frequency range to generate a combined reference signal for driving a reference load. A first power supply (e.g. SMPS) is configured to generate a first output based on the first reference signal. A second power supply (e.g. linear regulator) is configured to generate a second output based on the second reference signal. A power combiner circuit is configured to combine the first output with the second output to generate a combined output for driving an output load. The first reference and second reference may be controlled by the power stabilization stage in a manner that reduces the resonance in the combined output.

In one embodiment, the power stabilization stage comprises a first reference supply configured to operate in the first frequency range and to generate the first reference signal. A second reference supply is configured to operate in the second frequency range and to generate the second reference signal. A reference combiner circuit is configured to combine the first reference signal with the second reference signal to generate the combined reference signal for driving the reference load. At least one of the reference supplies has an output impedance that is greater than ten percent of the reference impedance.

In one embodiment, the power supply system includes a feedback stage configured to generate one or more power supply control signals for controlling the power stabilization stage based on a difference between a control signal indicative of a desired output voltage and a feedback signal indicative of the combined output. Additionally, in one embodiment, the power stabilization system may be part of a RF PA system and provide a supply voltage or bias to a RF PA.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present disclosure can be readily understood by considering the following detailed description in conjunction with the accompanying drawings.

DETAILED DESCRIPTION OF EMBODIMENTS

The Figures (FIG.) and the following description relate to preferred embodiments of the present disclosure by way of illustration only. It should be noted that from the following discussion, alternative embodiments of the structures and methods disclosed herein will be readily recognized as viable alternatives that may be employed without departing from the principles of the disclosed embodiments.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the embodiments described herein.

Embodiments of the present disclosure relate to a power supply system with a power output stage that combines power output from a low-speed power supply and a high-speed power supply to generate a combined power output for driving a load. The power outputs are combined with a L-C circuit that can cause resonance in the combined power output. To prevent this resonance, a power stabilization stage is added before the final power output stage that substantially mirrors the power output stage and shares the same resonance characteristics as the power output stage.

Figure 1A:
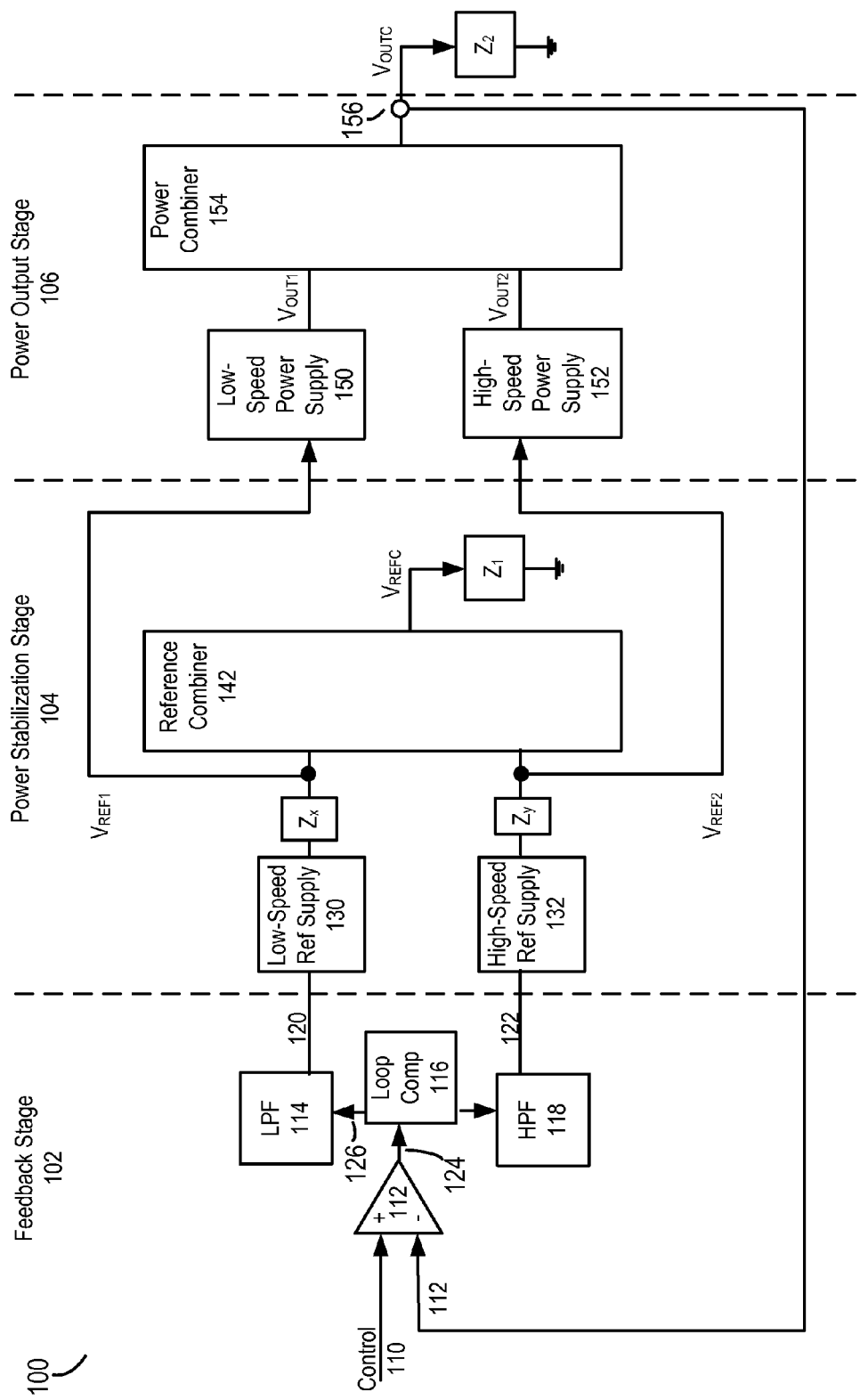
FIG. 1A illustrates a power supply system, according to an embodiment of the present disclosure.

FIG. 1A illustrates a power supply system 100, according to an embodiment of the present disclosure. The power supply system 100 receives a predetermined supply control signal 110 representing the desired output voltage $V_{OUTC}$ at the output of the power supply system 100 and generates an output voltage $V_{OUTC}$ in accordance with the predetermined supply control signal 110. The output voltage $V_{OUTC}$ provides power to and drives an output load $Z_2$. For example, the output load $Z_2$ can be a digital circuit or PA that has rapidly changing power requirements.

As shown, the power supply system 100 includes three circuit stages: a feedback stage 102, a power stabilization stage 104 and power output stage 106. The feedback stage 102 uses negative feedback to regulate the output of the power supply system 100 and includes an error amplifier 112, a loop compensation (Loop Comp) block 116, a low pass filter (LPF) 114 and a high pass filter (HPF) 118. The error amplifier 112 compares a feedback signal 112 with a predetermined supply control signal 110 representing the desired output voltage $V_{OUTC}$ at the output of the power supply system 100. The error amplifier 104 generates an error voltage 124 based on the difference between the feedback signal 112 and the supply control signal 110.

The loop compensation (Loop Comp) block 116, the LPF 114, and the HPF 118 generate a low-speed power supply control signal 120 and a high-speed power supply control signal 122 based on the error voltage 124. The low-speed power supply control signal 120 and the high-speed power supply control signal 122 operate in different frequency ranges. The low-speed power supply control signal 120 is passed through the LPF 114, which causes the low-speed power supply control signal 120 to include low-frequency and DC components for controlling a low-speed power path of the power supply system 100. The high-speed power supply control signal 122 is passed through the HPF 118, which causes the high-speed power supply control signal 122 to include high-frequency components for controlling a high-speed power path of the power supply system 100.

The loop compensation block 116 shapes a frequency response of the overall loop of the power supply system 100 to enhance stability. This function includes gain reduction at high frequencies as required by any control loop. Portions of the desired frequency shaping may naturally occur within any of the blocks in the power supply system 100, and therefore this function may be distributed within these blocks. In this case, the loop compensation block 116 may not be needed.

The power stabilization stage 104 stabilizes the output of the power supply system 100 and includes a low-speed reference supply 130, a high-speed reference supply 132, and a reference combiner circuit 142. Low-speed reference supply 130 generates a low-speed reference voltage signal $V_{REF1}$ from the low-speed power supply control signal 120. The low-speed reference supply 130 operates in a low frequency range and has a frequency response that matches the frequency response of the low-speed power supply 150. As a result, the low-speed reference voltage $V_{REF1}$ has a frequency response that is limited by the frequency response of the low-speed reference supply 130. High-speed reference supply 132 generates a high-speed reference voltage signal $V_{REF2}$ from the high-speed power supply control signal 120. The high-speed reference supply 132 operates in a high frequency range and has a frequency response that matches the frequency response of the high-speed power supply 150. As a result, the high-speed reference voltage $V_{REF2}$ has a frequency response that is limited by the frequency response of the high-speed reference supply 130. There may be overlap between the two different frequency ranges, but the highest end of the high-frequency range is generally higher than the highest end of the low-frequency range.

There are also output impedances $Z_x$ and $Z_y$ located at the respective outputs of the low-speed reference supply 130 and the high-speed reference supply 132. As will be explained by reference to FIG. 1B, the output impedances $Z_x$ and $Z_y$ reduce resonance within the power supply system 100, thereby increasing the stability of the power supply system 100.

The high-speed reference voltage signal $V_{REF1}$ and low-speed reference voltage signal $V_{REF2}$ are combined in the reference combiner circuit 142 to produce a combined reference voltage signal $V_{REFC}$. The reference combiner circuit 142 provides isolation between the output of the low-speed reference supply 130 and the output of the high-speed reference supply 132 while still combining the reference voltages $V_{REF1}$ and $V_{REF2}$. The combined reference voltage signal $V_{REFC}$ drives a reference load $Z_1$. The reference load $Z_1$ may be a dummy load within the power supply system 100 instead of an active device (e.g. PA or electronic circuit).

The power output stage 106 includes a low-speed power supply 150 paired with a high-speed power supply 152, both of which are coupled to a power combiner circuit 154. The low-speed power supply 150 receives the low-speed reference voltage signal $V_{REF1}$ and uses the low-speed reference voltage signal $V_{REF1}$ to control a level of its output voltage $V_{OUT1}$. The high-speed power supply 152 receives the high-speed reference voltage signal $V_{REF2}$ and uses the high-speed reference voltage signal $V_{REF2}$ to control a level of its output voltage $V_{OUT2}$. In one embodiment, the low-speed power supply 150 and high-speed power supply 152 have unitary voltage gain (but large current gain) and produce output voltages $V_{OUT1}$ and $V_{OUT2}$ that match their respective reference voltages $V_{REF1}$ and $V_{REF2}$.

The low-speed power supply 150 can be a SMPS, such as a buck converter, a boost converter, flyback converter, or other switching regulator. A SMPS typically has high power efficiency but a low frequency response, resulting in slow transient response time. The high-speed power supply 152 is operated in a low frequency range to compensate for slow changes to the desired output voltage $V_{OUTC}$. The high-speed power supply 152 can be a linear regulator that is less power efficient than a SMPS but has a higher frequency response and therefore faster transient response time than a SMPS. One example of a linear regulator is a push-pull regulator that can both sink and source current. The high-speed power supply 152 is operated in a higher frequency range to compensate for fast changes in the desired output voltage $V_{OUTC}$.

The output voltages $V_{OUT1}$ and $V_{OUT2}$ are combined in the power combiner circuit 152 to produce the combined output voltage $V_{OUTC}$. The combined output voltage $V_{OUTC}$ is used to drive the output load $Z_2$. The combined output voltage $V_{OUTC}$ is sensed via a sensor 156 and fed back as a feedback signal 112 to the feedback stage 102. Sensing via sensor 156 may be simply a wired connection, or may be accomplished with a resistive divider, for example.

Figure 1B:
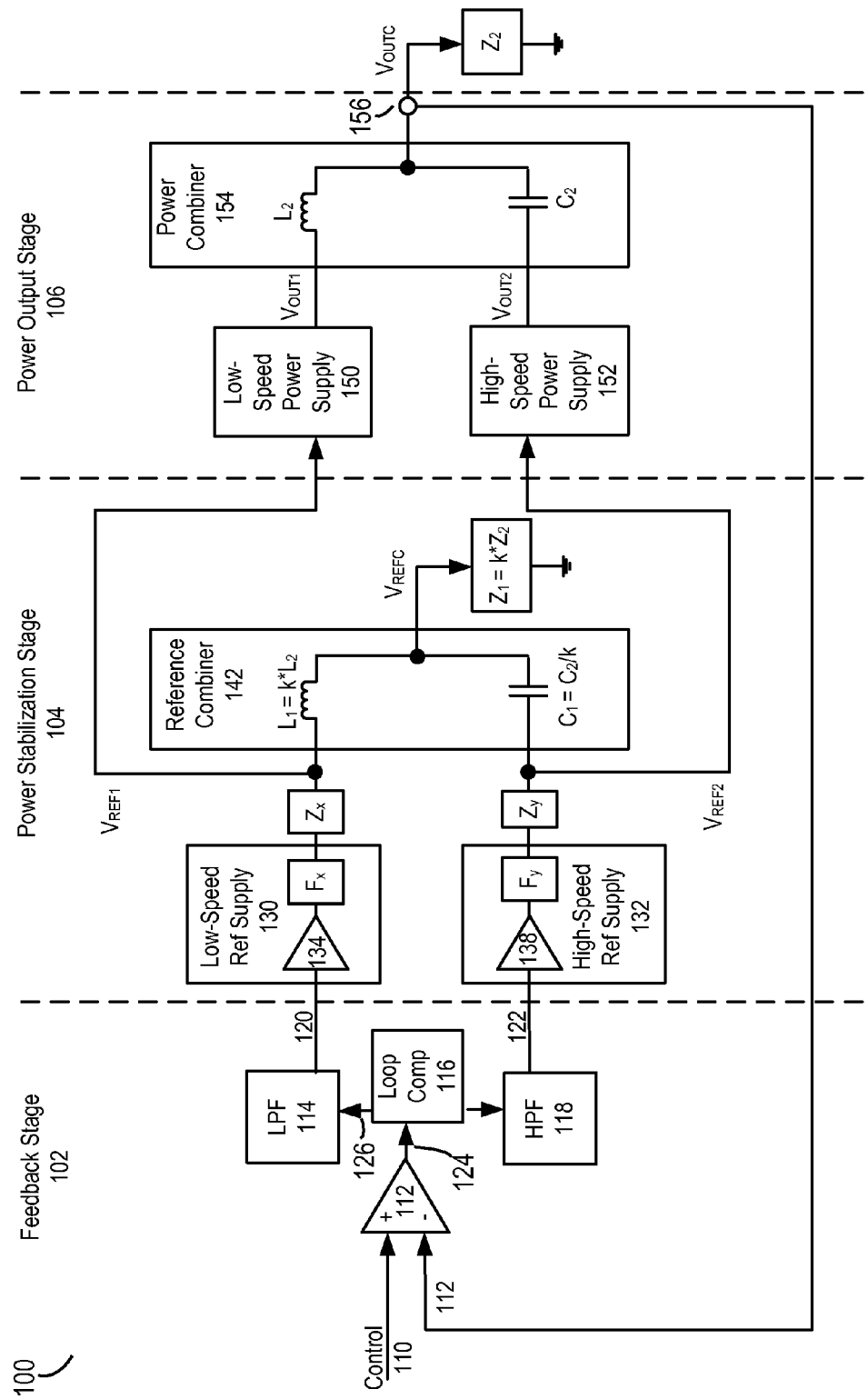
FIG. 1B illustrates the power supply system of FIG. 1A in more detail, according to an embodiment of the present disclosure.

FIG. 1B illustrates the power supply system 100 of FIG. 1A in more detail, according to an embodiment of the present disclosure. As shown, reference combiner circuit 142 includes an inductor $L_1$ connected in series with the output of the low-speed reference supply 130 to form a low pass network and a capacitor $C_1$ connected in series with the output of the high-speed reference supply 132 to form a high pass network. The inductor $L_1$ selectively passes power at low frequencies from the low-speed reference supply 130, and the capacitor $C_1$ selectively passes power at high frequencies from the high-speed reference supply 132. The inductor $L_1$ prevents the high-speed reference supply 132 from driving high frequency voltage into the output of the low speed reference supply 130, and the capacitor $C_2$ prevents the low-speed reference supply 130 from driving low-frequency voltage into the output of the high-speed reference supply 132.

Low-speed reference supply 130 includes a buffer amplifier 134 that generates a buffered output signal from the low-speed power supply control signal 120. The high-speed reference supply 132 also includes a buffer amplifier 138 that generates a buffered output signal from the high-speed power supply control signal 122. Examples of buffer amplifiers 134 and 138 include voltage follower amplifiers or emitter follower amplifiers that have a unitary voltage gain but provide some amount of current gain. The amount of current output supported by the buffer amplifiers 134 and 138 may be fairly low, so long as it is sufficient for providing power to the reference load $Z_1$.

The low-speed reference supply 130 and the high-speed reference supply 132 include respective frequency limiting circuits $F_x$ and $F_y$. The frequency limiting circuit $F_x$ limits the frequency response of the low-speed reference supply 130 (e.g., by limiting the frequency response of the buffer 134 output) so that it is substantially matches the frequency response of the low-speed power supply 150. The frequency limiting circuit $F_x$ limits the frequency response of the high-speed reference supply 132 ((e.g., by limiting the frequency response of the buffer 138 output) so that it is substantially matches the frequency response of the high-speed power supply 152. The frequency limiting circuits $F_x$ and $F_y$ can be, for example, gyrator circuits or other discrete frequency matching circuitry.

As previously mentioned, output impedances $Z_x$ and $Z_y$ are located at the respective outputs of the low-speed reference supply 130 and high-speed reference supply 132. The L-C configuration of the reference combiner circuit 142 can create unwanted resonance if proper phase and amplitude relationships are not maintained between the reference voltages $V_{REF1}$ and $V_{REF2}$. The output impedances $Z_x$ and $Z_y$ dampen resonant energy in the reference combiner circuit 142 to control the level of reference voltages $V_{REF1}$ and $V_{REF2}$ such that the resonance is minimized. Simulation results have generally shown that the output impedances $Z_x$ and $Z_y$ should be set to a value that is greater than 10% of the impedance of the reference load $Z_1$ to effectively dampen the resonance. In one embodiment, output impedances $Z_x$ and $Z_y$ are 16.6% of the impedance of the reference load $Z_1$. Additionally, the output impedances $Z_x$ and $Z_y$ may be different from each other or be the same. Additionally, in some embodiments only one of the two output impedances $Z_x$ and $Z_y$ is present.

Power combiner circuit 154 also includes an inductor $L_2$ connected in series with the output of the low-speed power supply 150 to form a low pass network and a capacitor $C_2$ connected in series with the output of the high-speed power supply 152 to form a high pass network. The inductor $L_2$ selectively passes power at low frequencies from the low-speed power supply 150, and the capacitor $C_2$ selectively passes power at high frequencies from the high-speed power supply 152.

As shown in FIG. 1B, reference combiner circuit 142 and reference load $Z_1$ are essentially a scaled replica of power combiner circuit 154 and output load $Z_2$. The amount of the scaling is represented by the ratio k, where k is the impedance ratio of the reference load $Z_1$ to the output load $Z_2$ and is typically much greater than 1. The reference load $Z_1$ has a substantially greater impedance than the output load $Z_2$. For example, the impedance of reference load $Z_1$ can be 1000 times greater than the impedance of output load $Z_2$. The high impedance of the reference load $Z_1$ means the power stabilization stage 104 consumes much less power than the power output stage 106. Higher impedances of the reference load $Z_1$ result in less power consumption but greater amounts of noise in the power supply system 100. Additionally, the inductance of inductor $L_1$ is k times greater than the inductance of inductor $L_2$. The capacitance of capacitor $C_1$ is k times less than capacitance of capacitor $C_2$.

Because the reference combiner circuit 142 and reference load $Z_1$ are a scaled version of the power combiner circuit 154 and output load $Z_2$, both circuits have similar resonance characteristics. Resonance in the power stabilization stage 104 is prevented with the use of output impedances $Z_x$ and $Z_y$. However, output impedances are not needed in the power output stage 106 to prevent resonance. This is because reference voltages $V_{REF1}$ and $V_{REF2}$, which are already resonance stabilized, are used as references for generating output voltages $V_{OUT1}$ and $V_{OUT2}$. Low-speed power supply 150 and high-speed power supply 152 both have unitary gain and have frequency responses that match their respective reference voltages $V_{REF1}$ and $V_{REF2}$, which results in $V_{OUT1}=V_{REF1}$ and $V_{OUT2}=V_{REF2}$ and guarantees that $V_{OUT1}$ and $V_{OUT2}$ are also resonance stabilized. Additionally, $V_{REFC}=V_{OUTC}$, although the current through intermediate load $Z_1$ will be much lower than the current through output load $Z_2$.

Despite the additional circuitry in the power stabilization stage 104, using the power stabilization stage 104 to prevent resonance in the power output stage 106 is still more power efficient than increasing the output impedance of the low-speed power supply 150 and high-speed power supply 152. This is because the power output stage 106 drives a high amount of current into the output load $Z_2$ so any additional impedance in the power output stage 106 consumes a high amount of power. On the other hand, the power stabilization stage 104 drives very little current into the reference load $Z_1$ and therefore does not consume much power.

Figure 2:
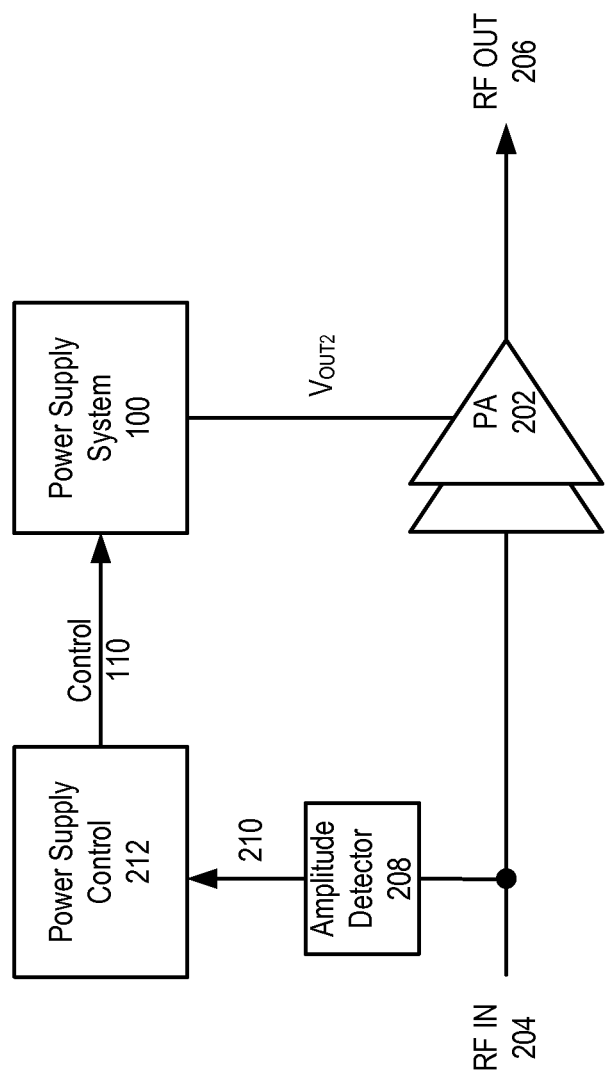
FIG. 2 illustrates a RF PA system that includes the power supply system of FIG. 1A, according to an embodiment of the present disclosure.

FIG. 2 illustrates a RF PA system 200 that includes the power supply system 100 of FIG. 1A, according to an embodiment of the present disclosure. The RF PA system 200 includes a PA 202 that amplifies a RF input signal 204 to generate a RF output signal 206. The RF PA system 202 uses envelope tracking to adjust the supply voltage or bias to the PA 202 so that it tracks the changing envelope of the RF input signal 204. To this end, the amplitude detector circuit 208 detects an envelope amplitude of the RF input signal 204 and generates an amplitude signal 210 that is indicative of the envelope amplitude of the RF input signal 204. In one embodiment, the amplitude detector 208 calculates the envelope amplitude as a function of digital modulation components (I and Q) of a baseband signal used to generate the RF input signal 208.

The power supply control circuit 212 uses the amplitude signal 210 to generate the supply control signal 110 that is indicative of a desired output voltage. In one embodiment, the power supply control circuit 212 may use a look up table that maps values of the amplitude signal 210 to values for the control signal 110. The power supply system 100 then uses the supply control signal 110 to generates a combined output voltage $V_{OUT2}$ that serves as the supply voltage or bias to the PA 202.

Upon reading this disclosure, those of ordinary skill in the art will appreciate still additional alternative structural and functional designs for stabilizing a power combining power supply system through the disclosed principles of the present disclosure. Thus, while particular embodiments and applications of the present disclosure have been illustrated and described, it is to be understood that the embodiments are not limited to the precise construction and components disclosed herein. Various modifications, changes and variations which will be apparent to those skilled in the art may be made in the arrangement, operation and details of the method and apparatus of the present embodiments disclosed herein without departing from the spirit and scope of the disclosure as defined in the appended claims.

What is claimed is:

1. A power supply system, comprising:
    a power stabilization circuit stage configured to combine a first reference signal having a first frequency range with a second reference signal having a second frequency range that is different than the first frequency range to generate a combined reference signal for driving a reference load;
    a first power supply configured to generate a first output based on the first reference signal;
    a second power supply configured to generate a second output based on the second reference signal; and
    a power combiner circuit configured to combine the first output with the second output to generate a combined output for driving an output load.

2. The power supply system of claim 1, wherein the power stabilization circuit stage comprises:
    a first reference supply configured to operate in the first frequency range and to generate the first reference signal;
    a second reference supply configured to operate in the second frequency range and to generate the second reference signal; and
    a reference combiner circuit configured to combine the first reference signal with the second reference signal to generate the combined reference signal for driving the reference load.

3. The power supply system of claim 2, wherein the first power supply is configured to operate in the first frequency range and the second power supply is configured to operate in the second frequency range.

4. The power supply system of claim 2, wherein an output impedance of at least one of the first reference supply and the second reference supply is greater than ten percent of an impedance of the reference load.

5. The power supply system of claim 2, wherein:
    the reference combiner circuit comprises a first inductor coupled in series with the first reference signal and a first capacitor coupled in series with the second reference signal; and
    the power combiner circuit comprises a second inductor coupled in series with the first output and a second capacitor coupled in series with the second output.

6. The power supply system of claim 5, wherein an impedance of the reference load is greater than an impedance of the output load, the inductance of the first inductor is greater than an inductance of the second inductor, and a capacitance of the first capacitor is less than a capacitance of the second capacitor.

7. The power supply system of claim 6, wherein a ratio of the impedance of the reference load to the impedance of the output load, a ratio of the inductance of the first inductor to the inductance of the second inductor, and a ratio of the capacitance of the second capacitor to the capacitance of the first capacitor are the common ratio.

8. The power supply system of claim 1, wherein:
    the first power supply is a switching regulator; and
    the second power supply is a linear regulator.

9. The power supply system of claim 1, wherein the first power supply and the second power supply have unitary voltage gain.

10. The power supply system of claim 1, wherein a highest end of the second frequency range is higher than a highest end of the first frequency range.

11. The power supply system of claim 1, further comprising:
    a feedback circuit stage configured to generate one or more power supply control signals for controlling the power stabilization circuit stage based on a difference between a control signal indicative of a desired output voltage and a feedback signal indicative of the combined output.

12. The power supply system of claim 11, wherein the one or more power supply control signals include a first power supply control signal controlling the first reference signal and a second power supply control signal controlling the second reference signal.

13. A method of operation in a power supply system, comprising:
    combining a first reference signal having a first frequency range and a second reference signal having a second frequency range that is different than the first frequency range to generate a combined reference signal for driving a reference load;
    generating a first output based on the first reference signal;
    generating a second output based on the second reference signal; and
    combining the first output and the second output to generate a combined output for driving an output load.

14. The method of claim 13, further comprising:
    generating the first reference signal with a first reference supply configured to operate in the first frequency range; and
    generating the second reference signal with a second reference supply configured to operate in the second frequency range.

15. The method of claim 14, wherein the first output is generated with a first power supply configured to operate in the first frequency range and the second output is generated with a second power supply configured to operate in the second frequency range.

16. The method of claim 14 wherein at least one of the first reference supply and the second reference supply has an output impedance that is greater than ten percent of an impedance of the reference load.

17. The method of claim 14, wherein:
the first reference signal and the second reference signal are combined with a first inductor coupled in series with the first reference signal and a first capacitor coupled in series with the second reference signal, and
the first output and the second output are combined with a second inductor coupled in series with the first output and a second capacitor coupled in series with the second output.

18. The method of claim 17, wherein an impedance of the reference load is greater than an impedance of the output load, the inductance of the first inductor is greater than an inductance of the second inductor, and a capacitance of the first capacitor is less than a capacitance of the second capacitor.

19. The method of claim 18, wherein a ratio of the impedance of the reference load to the impedance of the output load, a ratio of the inductance of the first inductor to the inductance of the second inductor, and a ratio of the capacitance of the second capacitor to the capacitance of the first capacitor are a common ratio.

20. A radio frequency (RF) power amplifier (PA) system, comprising:
a RF PA configured to amplify a RF input signal to generate a RF output signal;
a power supply control circuit configured to generate a control signal based on an amplitude signal indicative of an amplitude of the RF input signal; and
a power supply system that comprises:
a power stabilization circuit stage configured to combine a first reference in a first frequency range with a second reference in a second frequency range that is different than the first frequency range to generate a combined reference for driving a reference load, the first and second reference generated based on the control signal;
a first power supply configured to generate a first output based on the first reference;
a second power supply configured to generate a second output based on the second reference; and
a power combiner circuit configured to combine the first output with the second output to generate a combined output for providing a supply voltage or bias to the RF PA.

\* \* \* \* \*